(12) United States Patent
Choi

(10) Patent No.: US 12,292,762 B2
(45) Date of Patent: May 6, 2025

(54) ELECTRONIC DEVICE INCLUDING HOUSING WITH FIDUCIAL MARK AND METHOD FOR MANUFACTURING THE SAME

(71) Applicant: Samsung Electronics Co., Ltd., Gyeonggi-do (KR)

(72) Inventor: Seungkwon Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 424 days.

(21) Appl. No.: 17/704,130

(22) Filed: Mar. 25, 2022

(65) Prior Publication Data
US 2022/0308627 A1    Sep. 29, 2022

Related U.S. Application Data

(63) Continuation of application No. PCT/KR2022/004004, filed on Mar. 22, 2022.

(30) Foreign Application Priority Data

Mar. 26, 2021    (KR) .................... 10-2021-0039599
Jun. 24, 2021    (KR) .................... 10-2021-0082659

(51) Int. Cl.
*G06F 1/16*     (2006.01)
*B29C 33/42*    (2006.01)
*B29L 31/34*    (2006.01)

(52) U.S. Cl.
CPC .......... *G06F 1/1637* (2013.01); *B29C 33/424* (2013.01); *G06F 1/1658* (2013.01); *B29L 2031/3437* (2013.01)

(58) Field of Classification Search
CPC .... G06F 1/1637; G06F 1/1658; G06F 1/1626; B29C 33/424; B29L 2031/3437; H04M 1/0266; H05K 13/04; H05K 13/08
See application file for complete search history.

(56) References Cited

U.S. PATENT DOCUMENTS

| 9,103,512 B2* | 8/2015 | Franklin ........... G02F 1/133608 |
| 10,347,852 B2* | 7/2019 | Myeong .............. H04M 1/0268 |
| 10,409,099 B2* | 9/2019 | Hsiao ................. G06V 40/1318 |
| 10,847,471 B2* | 11/2020 | Jones .................... H01L 23/544 |

(Continued)

FOREIGN PATENT DOCUMENTS

| JP | 8-250825 A | 9/1996 |
| JP | 11-179697 A | 7/1999 |

(Continued)

OTHER PUBLICATIONS

International Search Report dated Jun. 29, 2022.
Extended European Search Report dated Apr. 30, 2024.

*Primary Examiner* — Rockshana D Chowdhury
(74) *Attorney, Agent, or Firm* — Cha & Reiter, LLC

(57) ABSTRACT

According to certain embodiments, an electronic device comprises: a front case including a seating portion, and a display module disposed in the seating portion; wherein the front case includes a first fiducial mark, wherein the first fiducial mark includes: a first fiducial gap; a first area surrounding at least a portion of the first fiducial gap having a first surface roughness; and a second area exclusive with the first area, having a second surface roughness that is different from the first surface roughness.

15 Claims, 7 Drawing Sheets

(56) References Cited

U.S. PATENT DOCUMENTS

| | | |
|---|---|---|
| 10,931,326 B2 * | 2/2021 | Liu .................... H04B 1/3888 |
| 11,327,537 B2 * | 5/2022 | Chun ................... G06F 1/1626 |
| 2006/0232728 A1 | 10/2006 | Kim |
| 2006/0252261 A1 | 11/2006 | Tanaka et al. |
| 2008/0047937 A1 | 2/2008 | Giandomenico et al. |
| 2012/0040490 A1 | 2/2012 | Gallazzo et al. |
| 2014/0037945 A1 | 2/2014 | Suga et al. |
| 2017/0187934 A1 * | 6/2017 | Kwak .................. G06F 1/1686 |
| 2017/0212613 A1 * | 7/2017 | Hwang ................ G06F 1/1684 |
| 2018/0321552 A1 * | 11/2018 | Sugihara .............. G02B 5/3033 |
| 2019/0288047 A1 * | 9/2019 | Jeong ................... H10K 71/00 |
| 2020/0225711 A1 * | 7/2020 | Pelissier .............. G06F 1/1624 |
| 2020/0310489 A1 * | 10/2020 | Spraggs ............... H04N 23/45 |
| 2021/0168231 A1 * | 6/2021 | Baker .................... H05K 1/189 |
| 2021/0227706 A1 * | 7/2021 | Jung .................... G06F 1/1686 |
| 2021/0274658 A1 | 9/2021 | Park |
| 2021/0294475 A1 | 9/2021 | Lee et al. |
| 2021/0408433 A1 * | 12/2021 | Kim ...................... H10K 71/00 |
| 2022/0093692 A1 * | 3/2022 | Li ........................ H10K 59/8792 |
| 2022/0284214 A1 * | 9/2022 | Tomasetta ............ G06V 40/172 |
| 2022/0286545 A1 * | 9/2022 | Koch .................... G06F 1/1637 |
| 2022/0314574 A1 * | 10/2022 | Qian ..................... B32B 3/263 |

FOREIGN PATENT DOCUMENTS

| | | |
|---|---|---|
| JP | 2001-356006 A | 12/2001 |
| JP | WO2012/105474 A1 | 8/2012 |
| JP | 2014-45013 A | 3/2014 |
| JP | 2018-189939 A | 11/2018 |
| KR | 10-2004-0008590 A | 1/2004 |
| KR | 10-2006-0017242 A | 2/2006 |
| KR | 10-2006-0109088 A | 10/2006 |
| KR | 10-2008-0014708 A | 2/2008 |
| KR | 10-2009-0080111 A | 7/2009 |
| KR | 10-2013-0108440 A | 10/2013 |
| KR | 10-2015-0061144 A | 6/2015 |
| KR | 10-2018-0073451 A | 7/2018 |
| KR | 10-2019-0142187 A | 12/2019 |
| KR | 10-2020-0013201 A | 2/2020 |

* cited by examiner

ELECTRONIC DEVICE INCLUDING HOUSING WITH FIDUCIAL MARK AND METHOD FOR MANUFACTURING THE SAME

CROSS-REFERENCE TO RELATED APPLICATION(S)

Claim of Priority

This application is a continuation of International application No. PCT/KR2022/004004 filed on Mar. 22, 2022, in the Korean Intellectual Property Receiving Office and claiming priority to Korean Patent Application 10-2021-0039599, filed in the Korean Intellectual Property Office on Mar. 26, 2021 and Korean Patent Application 10-2021-0082659, filed in the Korean Intellectual Property Office on Jun. 24, 2021, the entire disclosures of which is incorporated herein by reference.

TECHNICAL FIELD

Certain embodiments relate to an electronic device including a housing (e.g., a front case) including a fiducial mark and a method for manufacturing the same.

BACKGROUND

In the production process of an electronic device, a bonding device may apply an adhesive onto the front case of the electronic device and may attach a window on the adhesive-applied front case. The window may be applied on a display module in a position of the adhesive. In order for the bonding device to accurately recognize where the adhesive is to be applied, fiducial mark(s) may be placed on the front case. The fiducial mark(s) serve as reference point(s) for recognizing the position and/or direction in which the front case is placed.

The fiducial mark may include a fiducial gap that is a through hole or a recess. The fiducial gap may be recognized as a black area by an optical device included in the bonding device. The bonding device may recognize the position and/or direction in which the front case is placed by using the black area to apply the adhesive.

When the bonding device recognizes only the fiducial gap, which is a black area on the front case, the bonding device may mistakenly deems the front case as having a defect. As a result, the bonding device pulls out the front case without applying adhesive.

Laser hatching may be performed around the fiducial gap to avoid misrecognition of a defect. The laser hatching allows the bonding device to recognize the area around the fiducial gap as brighter than the fiducial gap. However, due to a deviation between laser patterns that are on manufactured front cases, the bonding device may still misrecognize defects.

SUMMARY

According to certain embodiments, an electronic device comprises: a front case including a seating portion, and a display module disposed in the seating portion; wherein the front case includes a first fiducial mark, wherein the first fiducial mark includes: a first fiducial gap; a first area surrounding at least a portion of the first fiducial gap having a first surface roughness; and a second area exclusive with the first area, having a second surface roughness that is different from the first surface roughness.

According to certain embodiments, a method for manufacturing an electronic device, the method comprises: coupling a first portion of a mold and a second portion of the mold to a core, wherein the first portion of the mold is a mold of a front case having a fiducial gap to have a first surface roughness, and wherein the second portion of the mold of a first area surrounding at least a portion of the fiducial gap having a second surface roughness different from the first surface roughness; and molding the front case including a fiducial mark including the fiducial gap, the first area having the second surface roughness and a second area having the first surface roughness, using the mold.

DETAILED DESCRIPTION

According to certain embodiments of the disclosure, there may be provided a housing that allows a bonding device to precisely recognize a fiducial gap, an electronic device including the housing, and/or a method for manufacturing the same.

According to certain embodiments, an electronic device includes a front case including a fiducial mark and a method for manufacturing the same. The front case of the electronic device may include two or more areas having different surface roughness around the fiducial gap. A bonding device is able to recognize the two or more areas having different surface roughness, located around the fiducial gap, as well as the fiducial gap on the front case. This reduces the chance of misrecognition of the fiducial gap.

According to certain embodiments, the front case of the electronic device may include two or more areas having different surface roughness around the fiducial gap. A method for manufacturing an electronic device may form two or more areas having different surface roughness on a mold for manufacturing the front case through electro discharge machining. When the front case is manufactured using the mold, there is very little deviation between the manufactured front case products. Thus, it is possible to reduce the possibility of misrecognition of the fiducial gap by the bonding device.

Figure 1:
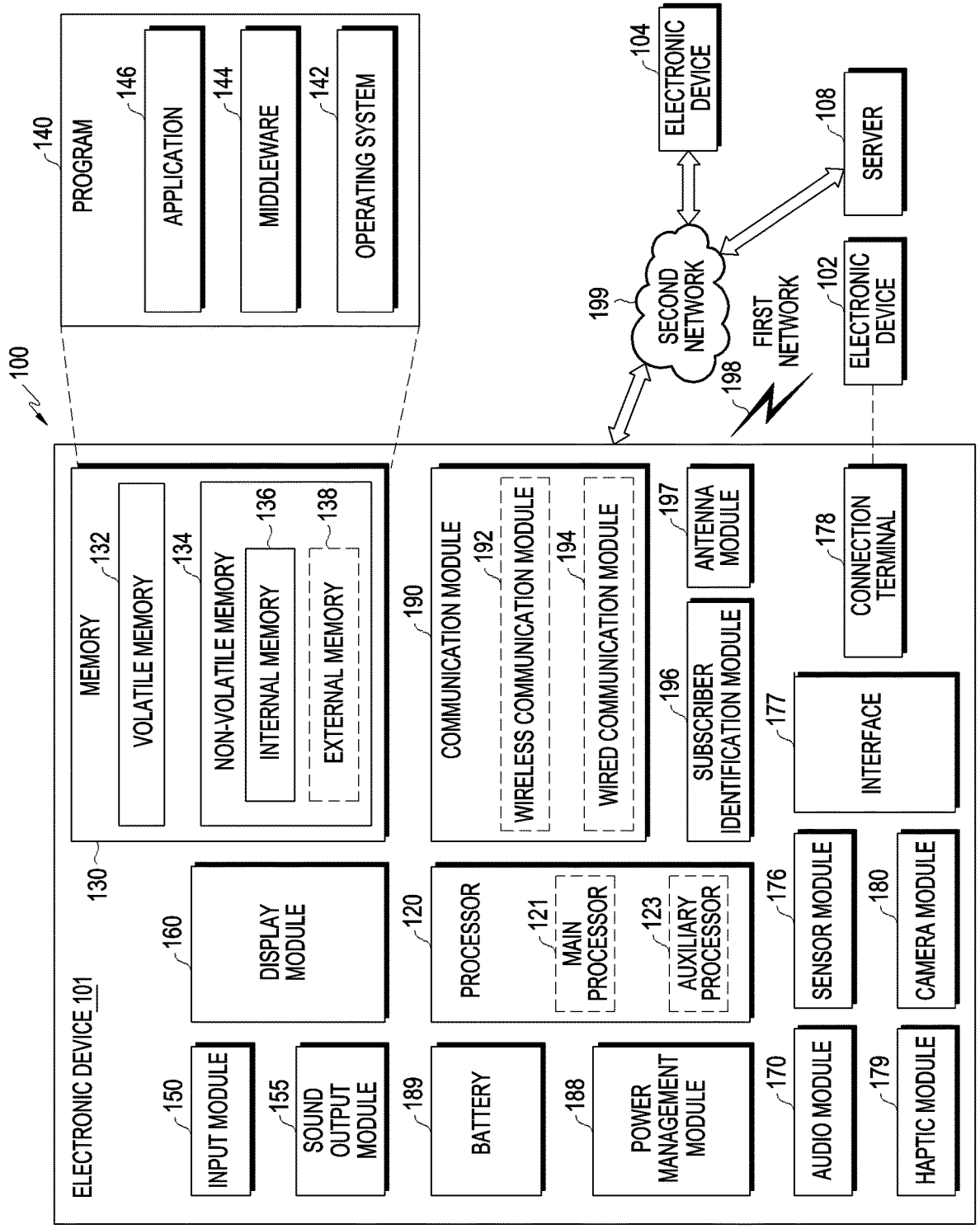
FIG. 1 is a block diagram illustrating an electronic device in a network environment according to certain embodiments of the disclosure.

The front case can form a portion of the housing of an electronic device. FIG. 1 describes an electronic device that can have a housing that includes a front case.

Electronic Device

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123. The auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. The receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. The display 160 may include a touch sensor configured to detect a touch, or a pressure sensor configured to measure the intensity of a force generated by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). The antenna module 197 may include one antenna including a radiator formed of a conductor or conductive pattern formed on a substrate (e.g., a printed circuit board (PCB)). The antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

The antenna module 197 may form a mmWave antenna module. The mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. The external electronic device 104 or the server 108 may be included in the second network 199. The electronic device 101 may be applied to intelligent services (e.g., smart home, smart city, smart car, or health-care) based on 5G communication technology or IoT-related technology.

The foregoing components can be disposed in a housing. For example, in smartphone, the foregoing components can be placed in a flat and generally rectangular housing. The display module 160 is disposed proximately on and usually consumes most if not all of one of surfaces (normally referred to as the front surface). The display module 160 can be protected by a window. The window can be made of glass or plastic.

Figure 2:
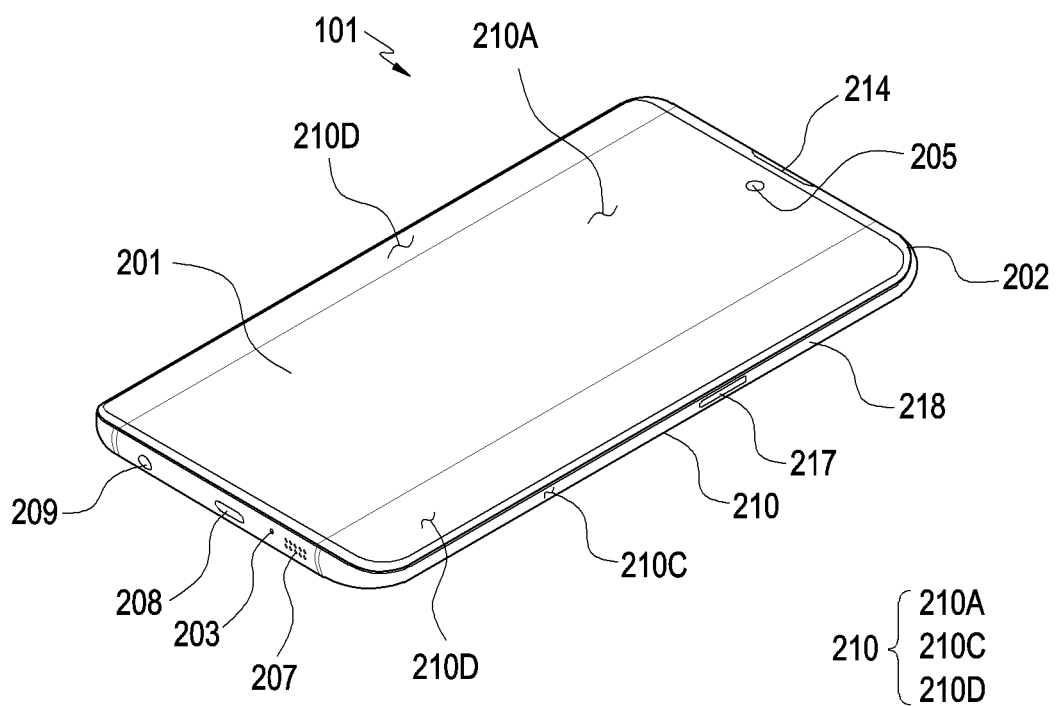
FIG. 2 is a front perspective view illustrating an electronic device according to certain embodiments of the disclosure.
Figure 3:
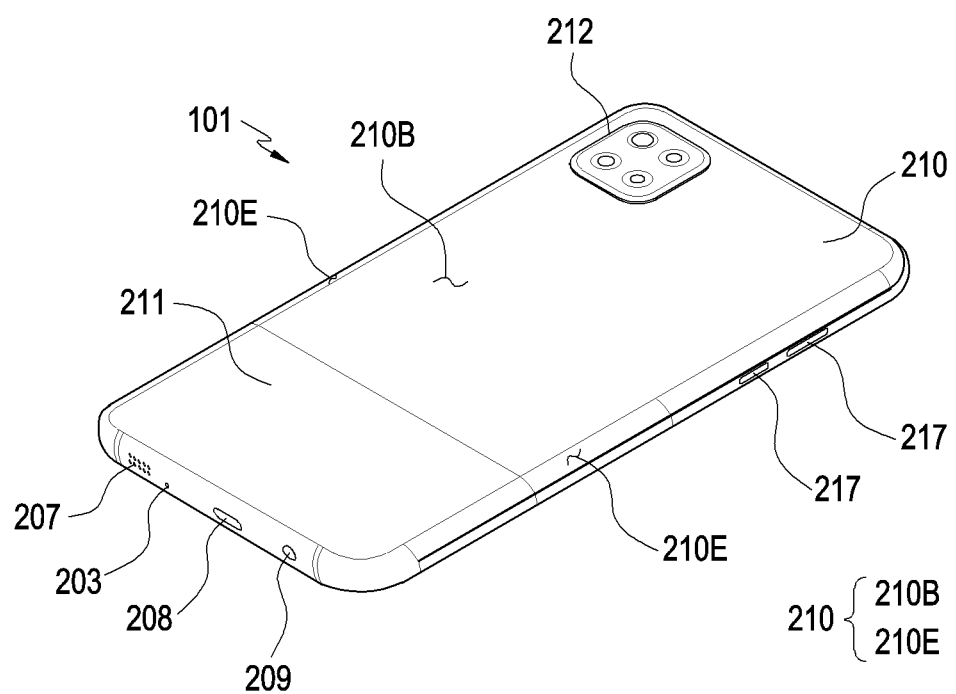
FIG. 3 is a rear perspective view illustrating an electronic device according to certain embodiments of the disclosure.

FIGS. 2 and 3 describe the electronic device disposed in a housing.

FIG. 2 is a front perspective view illustrating an electronic device according to certain embodiments of the disclosure; FIG. 3 is a rear perspective view illustrating an electronic device according to certain embodiments of the disclosure;

Referring to FIGS. 2 and 3, according to an embodiment, an electronic device 101 may include a housing 210 with a front surface 210A, a rear surface 210B, and a side surface 210C. The side surface 210C surrounds a space between the front surface 210A and the rear surface 210B. The electronic components of FIG. 1 can be disposed in space between the front surface 210A and the rear surface 210B that is surrounded by the side surface 210C.

According to another embodiment (not shown), the housing 210 may denote a structure forming part of the front surface 210A, the rear surface 210B, and the side surface 210C of FIG. 2. At least part of the front surface 210A may have a substantially transparent front plate 202 (e.g., a glass plate or polymer plate including various coat layers). The front plate 202 may include a window (e.g., window 430) disposed on the display module 160. The rear surface 210B may be formed by a rear plate 211. The rear plate 211 may be formed of, e.g., glass, ceramic, polymer, metal (e.g., aluminum, stainless steel (STS), or magnesium), or a combination of at least two thereof. The side surface 210C may be formed by a side bezel structure (or "side member") 218 that couples to the front plate 202 and the rear plate 211 and includes a metal and/or polymer. The rear plate 211 and the side bezel plate 218 may be integrally formed together and include the same material (e.g., glass, metal, such as aluminum, or ceramic).

The electronic device 101 may include a front case (e.g., the front case 410 or the housing 210 of FIG. 2) capable of mounting various components therein. A side surface of the front case may constitute the side bezel structure 218.

In the embodiment illustrated, the front plate 202 may include two first edge areas 210D, which seamlessly bend from the first surface 210A to the rear plate 211, on both the long edges of the front plate 202. In the embodiment (refer to FIG. 3) illustrated, the rear plate 211 may include two second edge areas 210E, which seamlessly bend from the rear surface 210B to the front plate 202, on both the long edges.

The front plate 202 (or the rear plate 211) may include only one of the first edge areas 210D (or the second edge areas 210E). According to another embodiment, the first edge areas 210D or the second edge areas 210E may partially be excluded. According to an embodiment, at side view of the electronic device 101, the side bezel structure 218 may have a first thickness (or width) for sides that do not have the first edge areas 210D or the second edge areas 210E and a second thickness, which is smaller than the first thickness, for sides that have the first edge areas 210D or the second edge areas 210E.

The electronic device 101 may include at least one of a display 201, audio modules 203, 207, and 214 (e.g., the audio module 170 of FIG. 1), a sensor module (e.g., the sensor module of FIG. 1). 176), camera modules 205 and 212 (e.g., the camera module 180 of FIG. 1), a key input device 217 (e.g., the input module 150 of FIG. 1), and connector holes 208 and 209 (e.g., the connection terminal 178 of FIG. 1). The electronic device 101 may exclude at least one (e.g., the connector hole 209) of the components or may add other components.

The display 201 may be visually exposed through, e.g., a majority portion of the front plate 202. At least a portion of the display 201 may be exposed through the front plate 202 forming the front surface 210A and the first edge areas 210D. The edge of the display 201 may be formed to be substantially the same in shape as an adjacent outer edge of the front plate 202. According to another embodiment (not shown), the interval between the outer edge of the display 201 and the outer edge of the front plate 202 may remain substantially even to give a larger area of exposure the display 201.

The surface (or the front plate 202) of the housing 210 may include a screen display area formed as the display 201 is visually exposed. For example, the screen display area may include the front surface 210A and first edge areas 210D.

According to another embodiment (not shown), the electronic device 101 may include a recess or opening formed in a portion of the screen display area (e.g., the front surface 210A or the first edge area 210D) of the display 201 and may include at least one or more of an audio module 214, a sensor module (not shown), a light emitting device (not shown), and a camera module 205 aligned with the recess or opening. According to another embodiment (not shown), at least one or more of the audio module 214, sensor module (not shown), camera module 205, fingerprint sensor (not shown), and light emitting device (not shown) may be included on the rear surface of the screen display area of the display 201.

According to an embodiment (not shown), the display 201 may be disposed to be coupled with, or adjacent, a touch detecting circuit, a pressure sensor capable of measuring the strength (pressure) of touches, and/or a digitizer for detecting a magnetic field-type stylus pen.

In some embodiments, at least a portion of the key input device 217 may be disposed on the side bezel structure 218.

The audio modules 203, 207, and 214 may include, e.g., a microphone hole 203 and speaker holes 207 and 214. The microphone hole 203 may have a microphone inside to obtain external sounds. There may be a plurality of microphones to be able to detect the direction of a sound. The speaker holes 207 and 214 may include an external speaker hole 207 and a phone receiver hole 214. The speaker holes 207 and 214 and the microphone hole 203 may be implemented as a single hole, or speakers may be included without the speaker holes 207 and 214 (e.g., piezo speakers).

The sensor modules (not shown) may generate an electrical signal or data value corresponding to an internal operating state or external environmental state of the electronic device 101. The sensor modules (not shown) may include a first sensor module (not shown) (e.g., a proximity sensor) and/or a second sensor module (not shown) (e.g., a fingerprint sensor) disposed on the front surface 210A of the housing 210 and/or a third sensor module (not shown) (e.g., an HRM sensor) and/or a fourth sensor module (not shown) (e.g., a fingerprint sensor) disposed on the rear surface 210B of the housing 210. In an embodiment (not shown), the fingerprint sensor may be disposed on the rear surface 210B as well as on the front surface 210A (e.g., the display 201) of the housing 210. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not shown).

The camera modules 205 and 212 may include a front camera module 205 disposed on the first surface 210A of the electronic device 101 and a rear camera module 212 and/or a flash (not shown) disposed on the rear surface 210B. The camera modules 205 and 212 may include one or more lenses, an image sensor, and/or an image signal processor. The flash may include, e.g., a light emitting diode (LED) or a xenon lamp. Two or more lenses (an infrared (IR) camera, a wide-angle lens, and a telescopic lens) and image sensors may be disposed on one surface of the electronic device 101.

The key input device 217 may be disposed on the side surface 210C of the housing 210. According to another embodiment, the electronic device 101 may exclude all or some of the above-mentioned key input devices 217 and the excluded key input devices 217 may be implemented in other forms, e.g., as soft keys, on the display 201.

The light emitting device (not shown) may be disposed on, e.g., the front surface 210A of the housing 210. The light emitting device (not shown) may provide, e.g., information about the state of the electronic device 101 in the form of light. The light emitting device (not shown) may provide a light source that interacts with, e.g., the front camera module 205. The light emitting device (not shown) may include, e.g., a light emitting diode (LED), an infrared (IR) LED, and/or a xenon lamp.

The connector holes 208 and 209 may include a first connector hole 208 for receiving a connector (e.g., a universal serial bus (USB) connector) for transmitting or receiving power and/or data to/from an external electronic device and/or a second connector hole (e.g., an earphone jack) 209 for receiving a connector for transmitting or receiving audio signals to/from the external electronic device.

Figure 4:
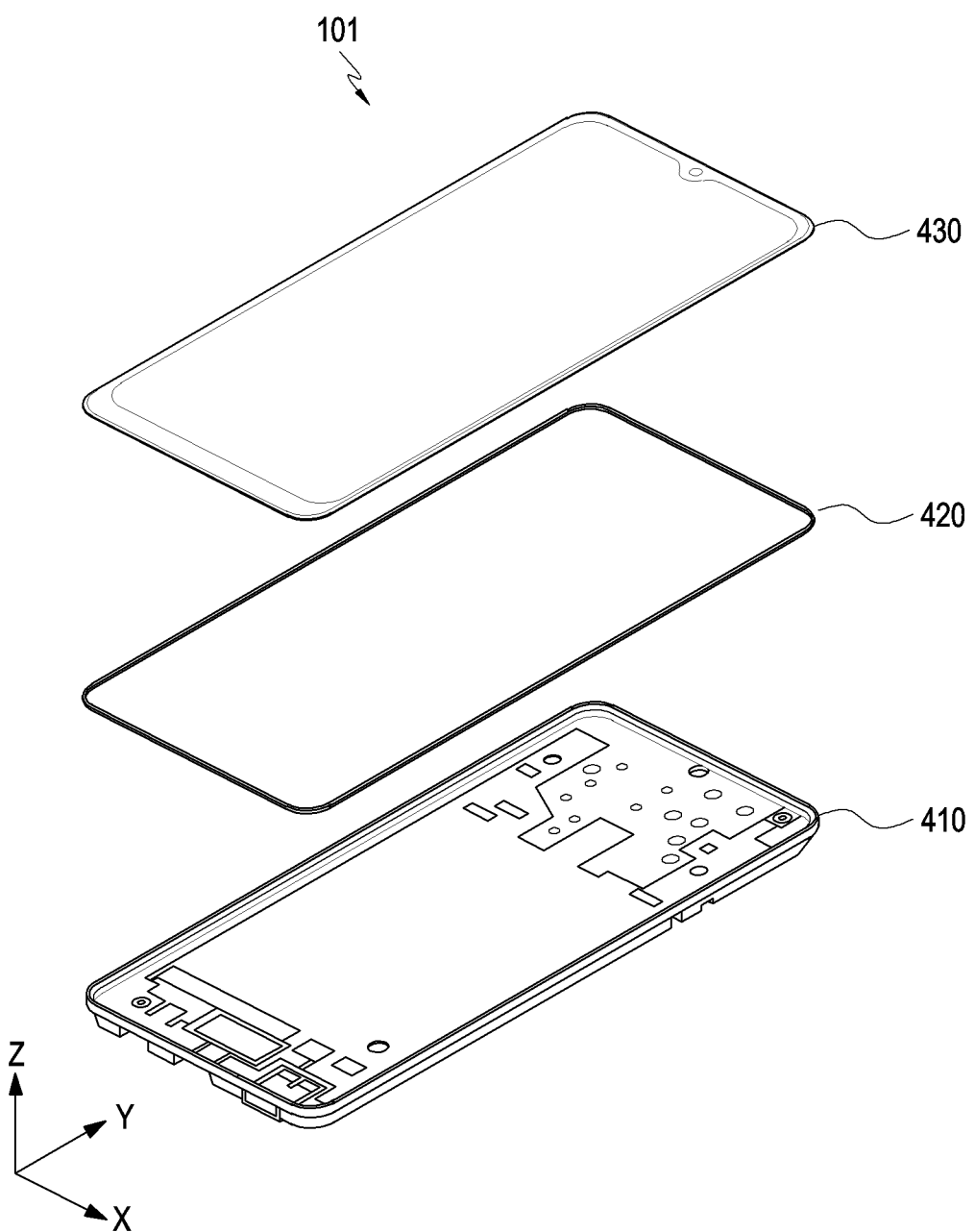
FIG. 4 is an exploded perspective view illustrating an electronic device according to certain embodiments of the disclosure.

As will be shown in FIG. 4, and as noted above, the front plate 202 may include a window (e.g., window 430) disposed on the display module 160. The front case (see FIG. 4, 410) can have a seating that receives the display module 160, 201. A bonding device may apply an adhesive 420 onto the front case 410 and may attach the window 430 to the adhesive on the front case.

FIG. 4 is an exploded perspective view illustrating an electronic device according to certain embodiments of the disclosure.

Referring to FIG. 4, an electronic device 101 may include a window 430, an adhesive 420, and a front case 410. The window 430 may be included in the display module 160 of FIG. 1 and may be exposed to the outside of the electronic device 101. The window 430 may be included in the front plate 202 forming the front surface 210A of FIG. 2.

The window 430 may be attached onto the front case 410 by the adhesive 420. The adhesive 420 may be applied onto an adhesive portion 530 of the front case 410. The type of the adhesive 420 is not limited. The trajectory where the adhesive 420 is applied may form a closed loop. The shape of the trajectory where the adhesive 420 is applied is not limited to the shape illustrated in FIG. 4.

The height of the edge of the front case 410 in the Z-axis direction may be higher than the inside of the front case 410. As there is a step between the inside and the edge of the front case 410, a seating portion, which is a space for receiving the display module 160, may be formed inside the front case 410. The seating portion may be formed inside the area enclosed by the adhesive portion 530. Although other components of the display module 160 except for the window 430 are omitted in FIG. 4 for convenience of illustration, the other components of the display module 160 except for the window 430 may be positioned lower than the window 430 in the Z-axis direction and may be received in the seating portion. According to certain embodiments, in addition to the display module 160, other components of the electronic device 101 may be received in the seating portion.

A side surface of the front case 410 may form a side surface of the electronic device 101 and be exposed. The front case 410 may be implemented of a metal material. On a side of the front case 410, at least one of a key input device 217 (e.g., the input module 150 of FIG. 1), connector holes 208 and 209 (e.g., the connecting terminal 178 of FIG. 1), a speaker hole 207, or a microphone hole 203 may be disposed.

As will be shown in FIG. 5, in order for the bonding device to accurately recognize where the adhesive 420 is to be applied, fiducial mark(s) 510 may be placed on the front case 410. The fiducial mark(s) 510 serve as reference point(s) for recognizing the position and/or direction in which the front case 410 is placed.

Figure 5A:
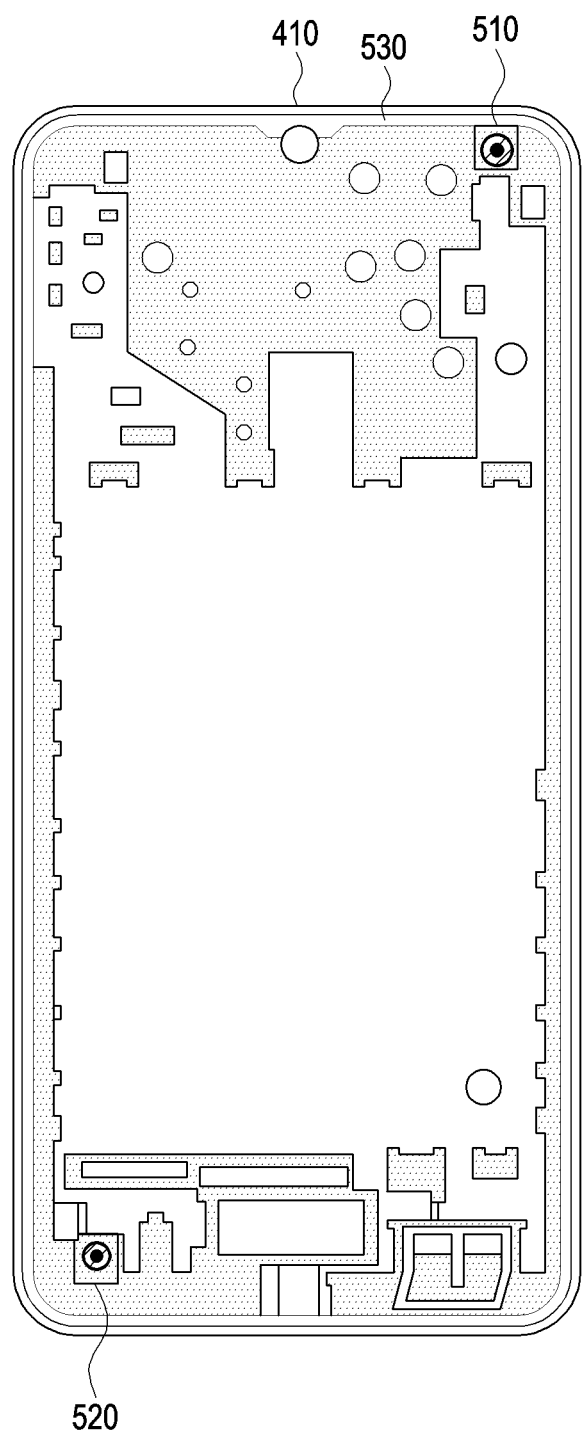
FIG. 5A is a front view illustrating a front case of an electronic device according to certain embodiments of the disclosure.

FIG. 5A is a front view illustrating a front case of an electronic device according to certain embodiments of the disclosure.

Referring to FIG. 5A, the front case 410 of the electronic device 101 may include a first fiducial mark 510, a second fiducial mark 520, and an adhesive portion 530.

The first fiducial mark 510 and the second fiducial mark 520 may be used to precisely determine the position for the adhesive portion 530, and the direction in which it is placed.

The fiducial marks 510, 520 allow a bonding device to recognize the precise position and alignment direction of the front case 410 during manufacturing. The first fiducial mark 510 and the second fiducial mark 520 may be formed on the surface with the adhesive portion 530 of the front and rear surfaces of the front case 410. The adhesive portion 530 may form a closed loop. The first fiducial mark 510 and the second fiducial mark 520 may be positioned inside the area defined by the closed loop formed by the adhesive portion 530.

Figure 5B:
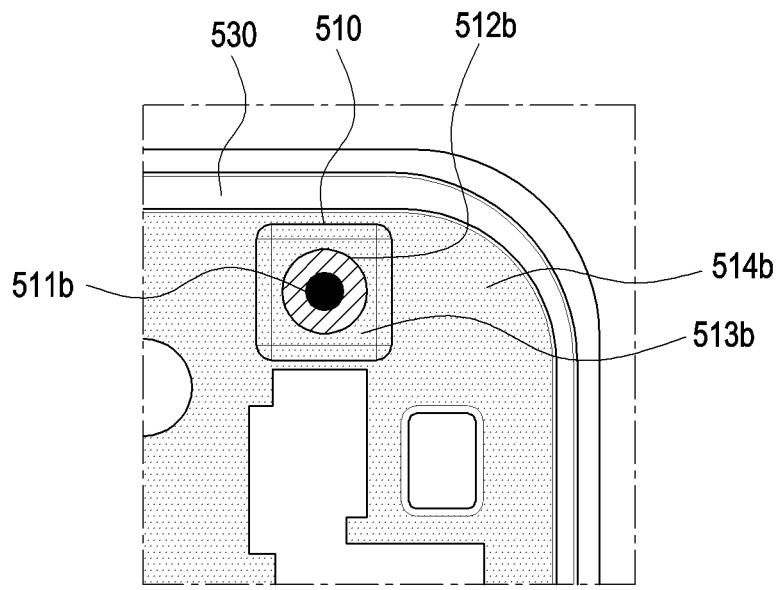
FIG. 5B is an enlarged front view illustrating the surroundings of a first fiducial mark of a front case of an electronic device according to certain embodiments of the disclosure.

FIG. 5B is an enlarged front view illustrating the surroundings of a first fiducial mark of a front case of an electronic device according to certain embodiments of the disclosure. Referring to FIG. 5B, the first fiducial mark 510 may include a first fiducial gap 511b, a first area 512b, and a second area 513b.

The fiducial gaps 511b may be recognized as a black area by an optical device included in the bonding device. To avoid mistaking the fiducial gap 511b as a defect, a laser hatching may be performed around the fiducial gap 511b. The laser hatching allows the bonding device to recognize the area around the fiducial gap as brighter than the fiducial gap. However, due to deviations in the laser patterning, the optical device may still mistake the front case has having a defect.

Accordingly, so that the optical device better recognizes the fiducial gap, the front case of the electronic device may include two or more areas having different surface roughness around the fiducial gap. This reduces the chance of mistaking the fiducial gap 511b as a defect.

The first fiducial gap 511b may be a through hole. The first fiducial gap 511b may be a recess having a lower level than that of the first area 512b and the second area 513b and not completely penetrated. Although FIG. 5B illustrates that the first fiducial gap 511b is circular, The shape of the first fiducial gap 511b is not limited thereto.

The first area 512b may be an area surrounding the first fiducial gap 511b. Although the first area 512b is shown as circular in FIG. 5B, The shape of the first area 512b is not limited thereto. For example, the first area 512b may have a polygonal shape. For example, the outline of the first area 512b may include straight lines, curves, and/or a combination of straight line(s) and curve(s). The first area 512b may have a first surface roughness.

The second area 513b may be an area surrounding the first area 512b. The second area 513b may be positioned at substantially the same (or within 10% deviation) height as the first area 512b. In other words, there may be no step difference between the second area 513b and the first area 512b.

A mold for manufacturing the front case 410, includes a first portion for forming the first fiducial gap 511b, the second area 513b, and a surrounding area 514b and a second portion for forming the first area 512b. When forming the mold, the first portion and the second portion are coupled to a core not to form a step. Thus, no step may exist between the second area 513b and the first area 512b.

The outline of the second area 513b may be the outline of the fiducial mark 510. The shape of the outline of the fiducial mark 510 is not limited to the shape illustrated in FIG. 5B which is provided by way of example, and not limitation.

The second area 513b may have a second surface roughness different from the surface roughness of the first area 512b. The second surface roughness of the second area 513b may be lower than the first surface roughness of the first area 512b. For example, Ra of the first area 512b may be 1.53 μm, and Ra of the second area 513b may be 0.93 μm. The first area 512b may be formed by a portion of the mold that has been electro discharge machined with AEP-18, and the second area 513b may be formed by a portion of the mold that has been electro discharge machined with AEP-10.

Alternatively, the second surface roughness of the second area 513b may be higher than the first surface roughness of the first area 512b. For example, Ra of the first area 512b may be 0.93 μm, and Ra of the second area 513b may be 1.53 μm. The first area 512b may be formed by a portion of the mold that has been electro discharge machined with AEP-10, and the second area 513b may be formed by a portion of the mold that has been electro discharge machined with AEP-18.

In another example, the first area 512b may be a mirror surface having an Ra of 0.1 μm or less. The second area 513b may be formed by a portion of the mold treated with fine erosion, and as a result, the roughness of the second area 513b may be lower than the roughness of the first area 512b. In another example, the first area 512b may be a mirror surface having an Ra of 0.1 μm or less. The second area 513b may be formed by a portion of the mold treated with rough erosion, and as a result, the roughness of the second area 513b may be higher than the roughness of the first area 512b.

The surface roughness of the surrounding area 514b surrounding the fiducial mark 510 in the front case 410 may be substantially the same as the surface roughness (or within 10% Ra deviation) of the second area 513b.

The bonding device used in the process of manufacturing the electronic device 101 may include an optical device. The optical device may obtain an image of the first fiducial mark 510 and the surroundings of the first fiducial mark 510. In the obtained image, since the roughness of the first area 512b and the roughness of the second area 513b are different from each other, the bonding device may accurately recognize the first area 512b and the second area 513b. Since the first fiducial gap 511b may be recognized as a black area, and a brightness contrast exists between the first area 512b and the first fiducial gap 511b, the bonding device may precisely identify the position of the first fiducial gap 511b.

The pattern of the first area 512b surrounding the fiducial gap 511b, and the second area 513b surrounding the first area 512b reduces the likelihood of mistaking the fiducial gap 511b as a defect. Specifically, the light reflecting from the first area 512b and the second area 513b due to the different roughness results in rather unambiguous and distinct pattern that is not likely to be mistaken.

The bonding device may identify the coordinates of a specific position in the first fiducial gap 511b and may identify the position of the first fiducial mark 510 based on the identified coordinates. For example, the bonding device may identify the center coordinates of the circular first fiducial gap 511b as the position of the first fiducial mark 510.

Figure 5C:
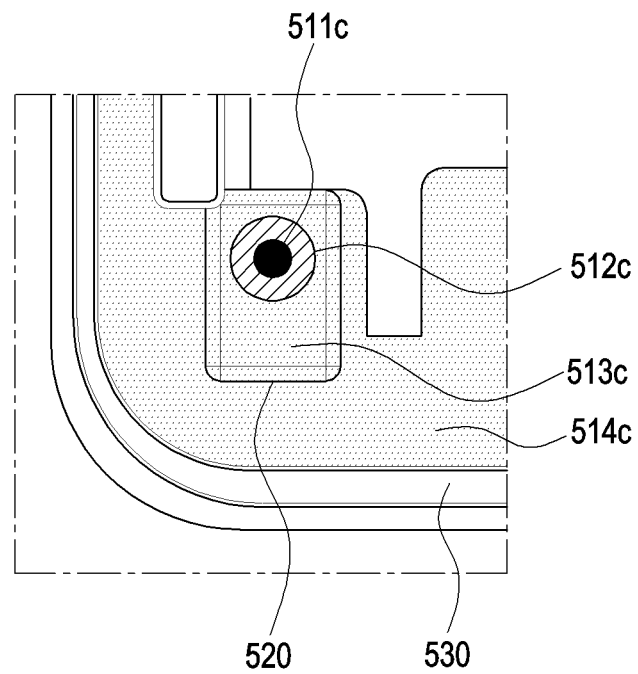
FIG. 5C is an enlarged front view illustrating the surroundings of a second fiducial mark of a front case of an electronic device according to certain embodiments of the disclosure.

FIG. 5C is an enlarged front view illustrating the surroundings of a second fiducial mark of a front case of an electronic device according to certain embodiments of the disclosure. Referring to FIG. 5C, a second fiducial mark 520 may include a second fiducial gap 511c, a third area 512c, and a fourth area 513c.

The second fiducial gap 511c may be a through hole. The second fiducial gap 511c may be a recess having a lower level than that of the third area 512c and the fourth area 513c and is not completely penetrated. Although FIG. 5C illustrates that the second fiducial gap 511c is circular, The shape of the second fiducial gap 511c is not limited thereto.

The third area 512c may be an area surrounding the second fiducial gap 511c. Although the outline of the third area 512c is shown as circular in FIG. 5C, the shape of the third area 512c is not limited thereto. The third area 512c may have a first surface roughness.

The fourth area 513c may be an area surrounding the third area 512c. The outline of the fourth area 513c may be the outline of the fiducial mark 510. The shape of the outline of the fiducial mark 510 is not limited to the shape illustrated in FIG. 5C.

The fourth area 513c may have a second surface roughness different from the surface roughness of the third area 512c. The second surface roughness of the fourth area 513c may be lower than the first surface roughness of the third area 512c. For example, Ra of the third area 512c may be 1.53 μm, and Ra of the fourth area 513c may be 0.93 μm. The third area 512c may be formed by a portion of the mold that has been electro discharge machined with AEP-18, and the fourth area 513c may be formed by a portion of the mold that has been electro discharge machined with AEP-10.

Alternative, the second surface roughness of the fourth area 513c may be higher than the first surface roughness of the third area 512c. For example, Ra of the third area 512c may be 0.93 μm, and Ra of the fourth area 513c may be 1.53 μm. The third area 512c may be formed by a portion of the mold that has been electro discharge machined with AEP-10, and the fourth area 513c may be formed by a portion of the mold that has been electro discharge machined with AEP-18.

In another example, the third area 512c may be a mirror surface having an Ra of 0.1 μm or less. The fourth area 513c may be formed by a portion of the mold treated with fine erosion, and as a result, the roughness of the fourth area 513c may be lower than the roughness of the third area 512c. In another example, the third area 512c may be a mirror surface having an Ra of 0.1 μm or less. The fourth area 513c may be formed by a portion of the mold treated with rough erosion, and as a result, the roughness of the fourth area 513c may be higher than the roughness of the third area 512c.

The surface roughness of the surrounding area 514c surrounding the fiducial mark 510 in the front case 410 may be substantially the same as the surface roughness (or within 10% Ra deviation) of the fourth area 513c.

The bonding device used in the process of manufacturing the electronic device 101 may include an optical device and may obtain an image of the second fiducial mark 520 and the surroundings of the second fiducial mark 520 through the optical device. In the obtained image, since the roughness of the third area 512c and the roughness of the fourth area 513c are different from each other, the bonding device may accurately recognize the third area 512c and the fourth area 513c. Since the second fiducial gap 511c may be recognized as a black area, and a brightness contrast exists between the third area 512c surrounding the second fiducial gap 511c and the second fiducial gap 511c, the bonding device may precisely identify the position of the second fiducial gap 511c.

The bonding device may identify the coordinates of a specific position in the second fiducial gap 511c included in the second fiducial mark 520 and may identify the position of the second fiducial mark 520 based on the identified coordinates. For example, the bonding device may identify the center coordinates of the circular second fiducial gap 511c as the position of the second fiducial mark 520.

The bonding device may identify the positions of the first fiducial mark 510 and the second fiducial mark 520. The memory of the bonding device stores information about the positions and shapes of the first fiducial mark 510, the second fiducial mark 520, and the adhesive portion 530 in the front case 410. The bonding device may identify the direction in which the front case 410 is aligned based on a relative difference between the identified positions of the first fiducial mark 510 and the second fiducial mark 520 and the positional relationship between the first fiducial mark 510 and the second fiducial mark 520 stored in the memory. Further, the bonding device may identify the position in which the front case 410 is aligned based on the identified position of at least one of the first fiducial mark 510 and the second fiducial mark 520 and the position, in the front case 410, of at least one of the first fiducial mark 510 and the second fiducial mark 520 stored in the memory. The bonding device may identify the position and direction in which the adhesive portion 530 is aligned by identifying the position and direction in which the front case 410 is aligned.

Although the shapes of the first fiducial mark 510 and the second fiducial mark 520 are illustrated as the same in FIG. 5A, The shapes of the first fiducial mark 510 and the second fiducial mark 520 are not necessarily identical.

Although the front case 410 including two fiducial marks, such as the first fiducial mark 510 and the second fiducial mark 520, is illustrated in FIG. 5A, The front case 410 may include three or more fiducial marks. In this case, the bonding device may recognize the positions of the three or more fiducial marks and precisely determine the position of the adhesive portion 530 by determining the direction in which the front case 410 is aligned based on relative position differences between the three or more fiducial marks.

Alternatively, The front case 410 may include one fiducial mark. The fiducial mark may be configured in a shape capable of indicating one or more directions, rather than a radially symmetric shape as illustrated in FIGS. 5A to 5C. For example, the fiducial mark may include a fiducial gap, a first area surrounding the fiducial gap, and a second area having a different surface roughness from the first area and surrounding the first area. The first area may be shaped as a combination of a circular shape as shown in FIGS. 5A to 5C and one or more straight lines indicating one or more specific directions. In this case, the bonding device may identify the position of the front case 410 by identifying the center coordinates of the fiducial gap, recognize the shape of the first area in the fiducial mark, and identify one or more directions indicated by one or more indicated straight lines, included in the first area, thereby determining the aligned direction of the front case 410 and thus precisely determining the position of the adhesive portion 530. In another example, the first area may have a polygonal shape.

Figure 6:
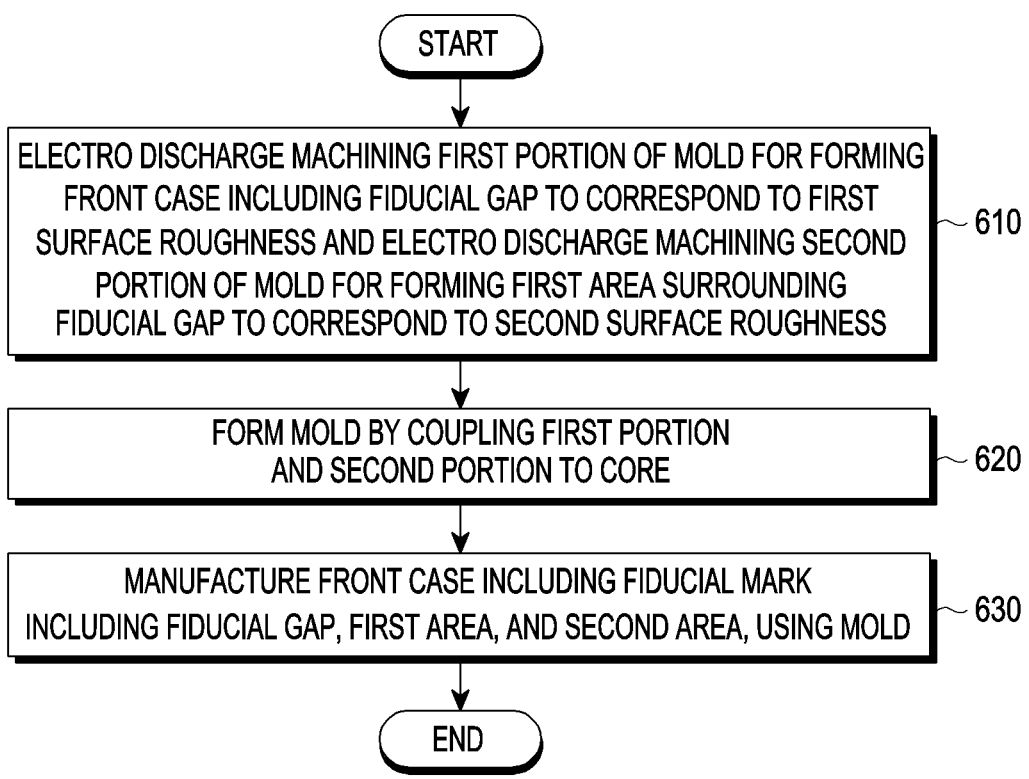
FIG. 6 illustrates operations for manufacturing an electronic device according to certain embodiments of the disclosure.

FIG. 6 illustrates operations for manufacturing an electronic device according to certain embodiments of the disclosure.

In operation 610, a first portion of the mold for forming the front case 410 of the electronic device 101 may be subjected to electro discharge machining to correspond to the first surface roughness. Here, the "first portion of the mold is subjected to electro discharge machining to correspond to the first surface roughness" may mean that, when the front case 410 is manufactured using the mold, electro discharge machining is performed so that the surface roughness of a portion of the surface of the front case 410 formed by the first portion of the mold is identical to the first surface roughness. The first portion of the mold may be a portion for forming the rest of the front case 410 except for the first area 512b and the third area 512b. The first portion of the mold may not include portions corresponding to the first area 512b and the third area 512b. In operation 610, a second portion of the mold for forming the front case 410 of the electronic device 101 may be subjected to electro discharge machining to correspond to the second surface roughness. The second portion of the mold may be a portion for forming the first area 512b and the third area 512b of the front case 410. The second portion may have a shape with a hole in the center, and the inner outline of the second portion may be identical in shape to the outline of the corresponding fiducial gap 512b or 512c. The outer outline of the second portion may be circular.

The first surface roughness and the second surface roughness may be different. For example, the first surface roughness may correspond to an Ra of 0.93 μm, and the second surface roughness may correspond to an Ra of 1.53 μm.

In operation 620, a mold for manufacturing the front case 410 may be formed by coupling the first part and the second part to the core. According to certain embodiments, when the first portion and the second portion are coupled to the core not to form a step, there may be no step between the first area 512b and the second area 513b, and there may be no step between the third area 512c and the fourth area 513c in the front case 410.

In operation 630, the front case 410 including the fiducial marks 510 and 520 including the fiducial gaps 511b and 511c, the first areas 512b and 512c, and the second areas 513b and 513c may be manufactured using the mold.

Although not shown in FIG. 6, the process of manufacturing the electronic device 101 may further include other operations in addition to the operations for manufacturing the front case 410, such as operations 610 to 630.

The process of manufacturing the electronic device 101 may further include the operation of obtaining an image of the front case 410 by a bonding device, the operation of identifying the aligned position and direction of the front case 410 by recognizing one or more fiducial marks 510 and 520 from the obtained image, the operation of identifying the position of the adhesive portion 530 of the front case 410, and the operation of applying an adhesive 420 to the adhesive portion 530 of the front case 410.

The bonding device may include an optical device and obtain an image of the front case 410 using the optical device. The bonding device may identify the coordinates of a specific position in the fiducial gap 511b or 511c included in the fiducial mark 510 or 520 to recognize one or more fiducial marks 510 and 520 and may identify the identified coordinates as the position of one or more fiducial marks 510 and 520. The memory of the bonding device stores information about the positions and shapes of the first fiducial mark 510, the second fiducial mark 520, and the adhesive portion 530 in the front case 410. The bonding device may identify the direction in which the front case 410 is aligned based on a relative difference between the identified positions of the first fiducial mark 510 and the second fiducial mark 520 and the positional relationship between the first fiducial mark 510 and the second fiducial mark 520 stored in the memory. Further, the bonding device may identify the position in which the front case 410 is aligned based on the identified position of at least one of the first fiducial mark 510 and the second fiducial mark 520 and the position, in the front case 410, of at least one of the first fiducial mark 510 and the second fiducial mark 520 stored in the memory. The bonding device may identify the position and direction in which the adhesive portion 530 is aligned by identifying the position and direction in which the front case 410 is aligned.

The process of manufacturing the electronic device 101 may further include the operation of attaching the window 430 of the display module 160 to the front case 410 to which the adhesive 420 is applied onto the adhesive portion 530.

According to certain embodiments, an electronic device (e.g., the electronic device 101) may comprise a front case (e.g., the housing 210 or the front case 410) including a seating portion, and a display module (e.g., the display module 430) disposed in the seating portion. The front case 410 may include a first fiducial mark 510. The first fiducial mark 510 may include: a first fiducial gap 511b; a first area 512b surrounding at least a portion of the first fiducial gap 511b having a first surface roughness; and a second area 513b exclusive with the first area 512b having a second surface roughness that is different from the first surface roughness.

According to certain embodiments, the first fiducial gap 511b may be a through hole.

According to certain embodiments, the first fiducial gap 511b may be a recess, and a level of the first fiducial gap 511 is lower than a level of the first area 512b and a level of the second area. 513b According to certain embodiments, the second area 513b may surround at least a portion of the first area 512b.

According to certain embodiments, the first surface roughness may be greater than the second surface roughness.

According to certain embodiments, the first area 512b may be circular-shape or polygonal-shape.

According to certain embodiments, the front case 410 may further comprise an adhesive portion 530 configured to receive an adhesive 420.

According to certain embodiments, the front case 410 may further include a second fiducial mark 520 formed in a different position from the first fiducial mark 510. The second fiducial mark 520 may include: a second fiducial gap 511c; a third area 512c surrounding the second fiducial gap 511c having a third surface roughness; and a fourth area 513c exclusive with the third area 512c. A third surface roughness may differ from a fourth surface roughness.

According to certain embodiments, the third surface roughness may be substantially equal to the first surface roughness.

According to certain embodiments, the fourth surface roughness may be substantially equal to the second surface roughness.

According to certain embodiments, the second fiducial gap 511c may be a through hole or a recess, and a level of the second fiducial gap is lower than a level of the third area 512c and a level of the fourth area 513c. According to certain embodiments, the fourth area 513c may surround the third area 512c.

According to certain embodiments, the third surface roughness may be higher than the fourth surface roughness.

According to certain embodiments, the third area 512c may be circular-shape or polygonal-shape.

According to certain embodiments, a method for manufacturing an electronic device (e.g., the electronic device 101) may comprise coupling a first portion of a mold and a second portion of the mold to a core, wherein the first portion of the mold is a mold of a front case 410 having a fiducial gap 511b to have a first surface roughness, and wherein the second portion of the mold is a mold of a first area 512b surrounding at least a portion of the fiducial gap 511b to have a second surface roughness different from the first surface roughness; and molding the front case 410 including a fiducial mark including the fiducial gap, the first area 512b having the second surface roughness and a second area 513b having the first surface roughness, using the mold.

According to certain embodiments, the fiducial gap 511b may be a recess, and and a level of the first fiducial gap 511 is lower than a level of the first area 512b and a level of the second area. 513b. According to various embodiments, the first surface roughness may be lower than the second surface roughness.

According to certain embodiments, the first area 512b may be formed to has a circular or polygonal shape.

According to certain embodiments, the method may further comprise identifying an aligned position and aligned direction of the front case 410 using the fiducial mark 510; and applying an adhesive to an adhesive portion 530 of the front case 410.

According to certain embodiments, the method may further comprise attaching a window of a display module 430 to the front case 410 in which the adhesive is applied to the adhesive portion 530.

The electronic device according to certain embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, The module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. Some of the plurality of entities may be separately disposed in different components. According to certain embodiments, one or more of the above-described components may be omitted, or one or more other components may be added. Alternatively or additionally, a plurality of components (e.g., modules or programs) may be integrated into a single component. In such a case, The integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a front case including a first surface and a seating portion forming at least a portion of the first surface, and
a display module disposed in the seating portion to face the first surface;
wherein the front case includes a first fiducial mark formed on the first surface,
wherein the first fiducial mark includes:
a first fiducial gap;
a first area surrounding at least a portion of the first fiducial gap having a first surface roughness; and
a second area disposed not to overlap with the first area when viewed in a direction perpendicular to the first surface, and having a second surface roughness that is different from the first surface roughness.

2. The electronic device of claim 1, wherein the first fiducial gap comprises a through hole.

3. The electronic device of claim 1, wherein the first fiducial gap comprises a recess, and a level of the first fiducial gap is lower than a level of the first area and a level of the second area.

4. The electronic device of claim 1, wherein the second area surrounds at least a portion of the first area.

5. The electronic device of claim 1, wherein the first surface roughness is greater than the second surface roughness.

6. The electronic device of claim 1, wherein the first area is circular-shaped or polygonal-shaped.

7. The electronic device of claim 1, further comprising an adhesive portion configured to receive an adhesive.

8. The electronic device of claim 1, wherein the front case further includes a second fiducial mark formed in a different position from the first fiducial mark,
wherein the second fiducial mark includes:
a second fiducial gap;
a third area surrounding the second fiducial gap having a third surface roughness; and
a fourth area not overlapping the third area having a fourth surface roughness different from the third surface roughness.

9. The electronic device of claim 8, wherein the third surface roughness is substantially equal to the first surface roughness.

10. The electronic device of claim 8, wherein the fourth surface roughness is substantially equal to the second surface roughness.

11. The electronic device of claim 8, wherein the second fiducial gap is a through hole or a recess, and a level of the second fiducial gap is lower than a level of the third area and a level of the fourth area.

12. The electronic device of claim 8, wherein the fourth area surrounds the third area.

13. The electronic device of claim 8, wherein the surface roughness of the third area is greater than the surface roughness of the fourth area.

14. The electronic device of claim 8, wherein the third area is circular-shaped or polygonal-shaped.

15. The electronic device of claim 1, wherein the first area and second area include hatched areas forming, respectively, the first surface roughness and the second surface roughness in a material of the front case.

* * * * *